United States Patent [19]

Marz et al.

[11] Patent Number: 4,814,887

[45] Date of Patent: Mar. 21, 1989

[54] AUTOMATIC FREQUENCY CONTROL

[75] Inventors: Daniel J. Marz; John D. Schilling, both of Dresher, Pa.

[73] Assignee: General Instrument Corporation, New York, N.Y.

[21] Appl. No.: 197,616

[22] Filed: May 23, 1988

[51] Int. Cl.$^4$ .............................................. H04N 5/50
[52] U.S. Cl. ................................ 358/195.1; 455/192; 455/182
[58] Field of Search ........................ 358/195.1, 191.1; 455/182, 192, 200

[56] References Cited

U.S. PATENT DOCUMENTS

| | | | |
|---|---|---|---|
| 3,980,951 | 9/1976 | Breeze et al. | 455/182 |
| 4,214,274 | 7/1980 | Rzeszewski et al. | 358/195.1 X |
| 4,263,611 | 4/1981 | Gibson et al. | 358/195.1 X |
| 4,263,675 | 4/1981 | Hongu et al. | 358/195.1 X |
| 4,392,254 | 7/1983 | Ecklund | 455/182 X |
| 4,556,988 | 12/1985 | Yoshisato | 455/192 X |
| 4,630,118 | 12/1986 | Suzuki | 455/182 X |

FOREIGN PATENT DOCUMENTS

| | | | |
|---|---|---|---|
| 60-236316 | 11/1985 | Japan | 358/195.1 |
| 60-236317 | 11/1985 | Japan | 358/195.1 |
| 60-236318 | 11/1985 | Japan | 358/195.1 |

Primary Examiner—James J. Groody
Assistant Examiner—E. Anne Faris
Attorney, Agent, or Firm—Kramer, Brufsky & Cifelli

[57] ABSTRACT

An automatic frequency control tracks a television signal before and after a period of interruption. The automatic frequency control comprises a voltage controlled feedback loop including a voltage controlled local oscillator and a mixer for mixing the output of the oscillator with the TV signal. The output of the mixer is filtered to remove unwanted components of the mixed signal and to equalize sidebands of the television signal. The output of the filter is supplied to a detector which is tuned to a component of the television signal, and produces a voltage corresponding to the frequency of the component. The output of the detector is supplied to the voltage control input of the local oscillator to track the television signal component. Circuitry automatically senses the absence of the TV signal component from the mixer, and automatically applies a reference voltage to the voltage control input of the oscillator when the TV signal component is absent. The detector is operative to detect the television signal component following the application of reference voltage to the oscillator so that when the television signal returns, the detector is capable of tracking it.

17 Claims, 6 Drawing Sheets

AUTOMATIC FREQUENCY CONTROL

BACKGROUND OF THE INVENTION

The invention relates generally to automatic frequency controls for television signals, and deals more particularly with an automatic frequency control which can track a television signal before and after a period of absence.

Heretofore, automatic frequency controls have been used to track video carriers of television signals at intermediate frequencies to optimize the reception of the television video and audio as described in more detail below. However, if the television signal is absent or interrupted even for a few milliseconds, the prior art automatic frequency control may substantially shift the intermediate frequency associated with the previous video carrier in a vain attempt to locate the video carrier. Consequently, when the video signal returns, the automatic frequency control may not be able to locate the video carrier.

The complete loss of the video signal may occur when one television segment ends and a new segment begins, or when a transmission satellite shifts between different up-links. Consequently, a manual control was required in the prior art automatic frequency control to aid the automatic frequency control in tracking the video carrier after a period of absence. The manual control is coupled to and activated by a channel selector such that when the channel is changed or a push button associated with the same channel is depressed, the video carrier is shifted to a nominal intermediate frequency which can be detected by the automatic frequency control. Even though the control can be activated by a viewer, the loss of the video signal is annoying, and the viewer may not know how to correct the problem. Also, if the loss occurs when a television program is being video-taped and no viewer is present, the remaining segment of the program may be lost.

Accordingly, a general object of the present invention is to provide an automatic frequency control which can track a television signal before and after a period of absence.

Another general object of the present invention is to provide a control of the foregoing type which does not interfere with normal tracking of the video carrier, or decrease the range of tracking.

SUMMARY OF THE INVENTION

The invention resides in an automatic frequency control which can track a television signal before and after a period of interruption. The automatic frequency control comprises a voltage controlled local oscillator and a mixer for mixing the output of the oscillator with the TV signal. THe output of the mixer is filtered to remove unwanted components of the mixed signal and to equalize sidebands of the television signal. The output of the filter is supplied to a detector which is tuned to a component of the television signal, and produces a voltage corresponding to the frequency of the component. The output of the detector is supplied to the voltage control input of the local oscillator to track the television signal component. Electronic means automatically senses the absence of the TV signal component from the mixer, and automatically applies a reference voltage to the voltage control input of the oscillator when the TV signal component is absent. The detector is operative to detect the television signal component following the application of references voltage to the oscillator so that when the television signal returns, the detector is capable of tracking it.

According to one feature of the invention, the electronic means comprises a comparator having a first input coupled to the output of the detector and a second input coupled to a source of threshold voltage. Consequently, when the detector substantially shifts the frequency of the local oscillator, the reference voltage is applied instead to the voltage control input of the oscillator. The substantial shift in the frequency of the local oscillator may occur when the television signal is absent.

According to other features of the invention, the absence of the television signal may be determined by the absence of horizontal synchronization pulses, the absence of the color carrier, or the lack of intensity of the television signal.

DETAILED DESCRIPTION OF THE PREFERRED EMBODIMENTS

Figure 1:
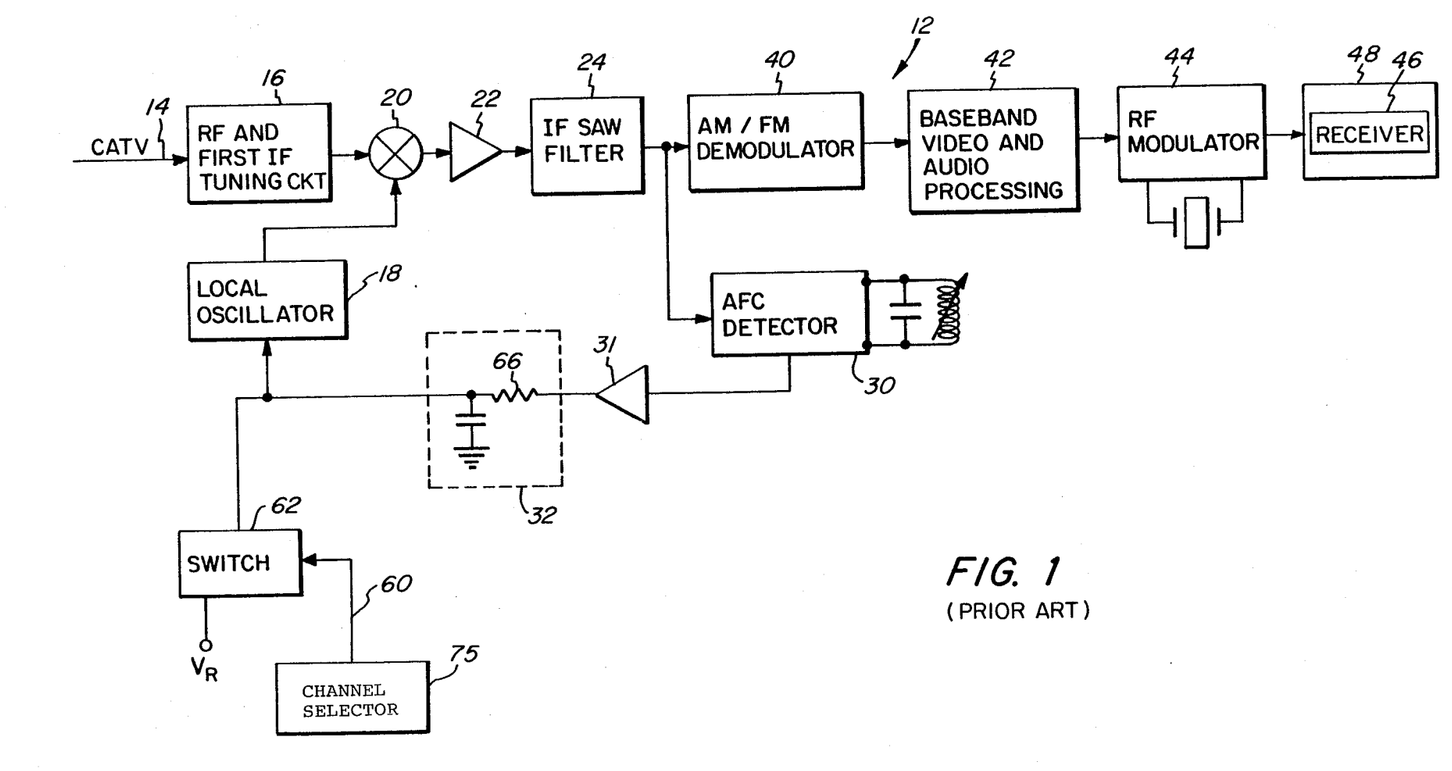
FIG. 1 is a block diagram of electronic components within an automatic frequency control embodying the prior art.
Figure 2:
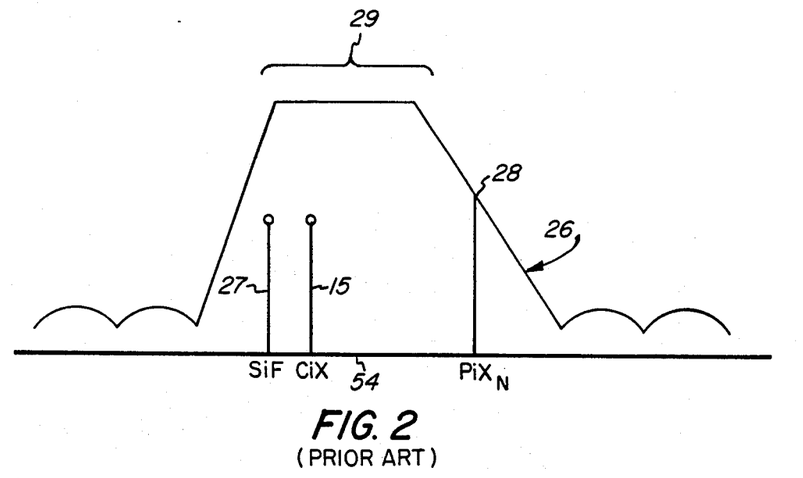
FIG. 2 is a graph illustrating carrier frequencies within a television channel of the prior art after second intermediate frequency mixing and filtering by electronic components of FIG. 1.

Referring now to the drawings in detail wherein like reference numerals indicate like elements throughout the several views. FIG. 1 illustrates an automatic frequency control generally designated 12 based on the prior art. A cable television (CATV) signal 14 is supplied to a standard RF and first intermediate frequency tuner circuit generally designated 16 to select a channel for viewing. The first intermediate frequency is well above the radio frequency of the CATV signal and is generated by an oscillator and mixer (neither shown) within circuit 16. The output of circuit 16 is then mixed in mixer 20 with the output of a local oscillator 18 to shift the channel to a second intermediate frequency. The second intermediate frequency channel is supplied to a Nyquist, IF SAW filter 24 via an amplifier 22. A frequency response curve 26 of filter 24 is illustrated in FIGURE 2. When the automatic frequency control 12 successfully tracks or locks onto the luminance or picture carrier, PIX, of the CATV signal, PIX is located approximately at an upper limit 28 of a passband 29 of the filter and is thereby attenuated approximately 6 decibels. Filter 24 equalizes the sidebands containing the luminance information, and also filters out unnecessary components of the mixed signal. A chrominance carrier, CIX, and a sound carrier, SIX, of the CATV signal are located within the passband but were originally transmitted approximately fifteen decibels below the original PIX.

Figure 3:
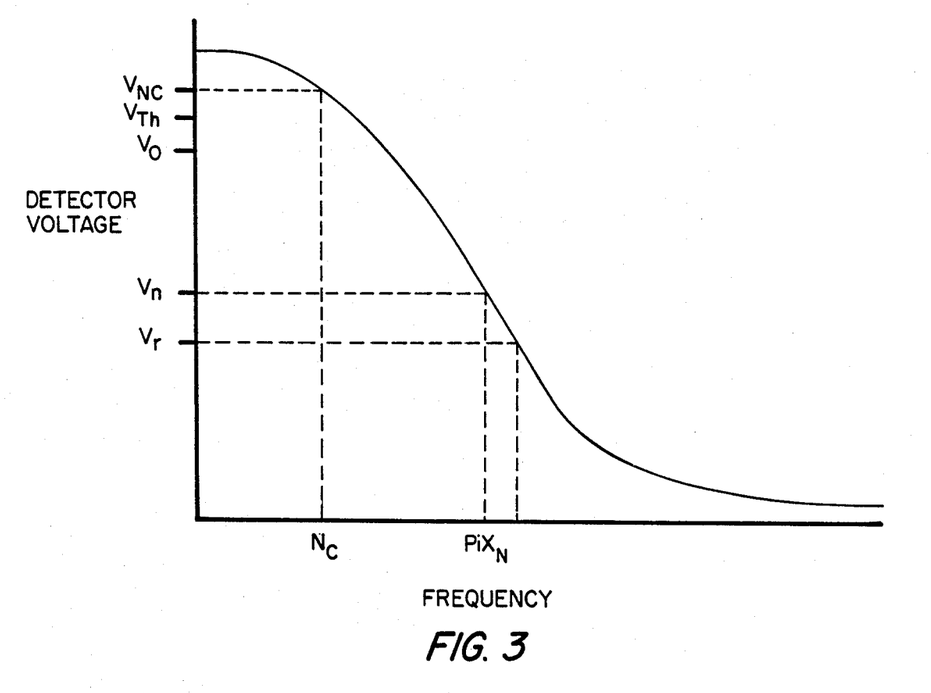
FIG. 3 is a graph illustrating the voltage output as a function of frequency of an automatic frequency control detector of FIG. 1.

The automatic frequency control 12 further includes a standard automatic frequency control detector 30 tuned to PIX. The voltage output as a function of frequency of detector 30 is illustrated in FIG. 3. Automatic frequency detectors such as detector 30 are well known in the art and therefore need not be described in detail herein.

When the instantaneous PIX frequency passed through filter 24 equals the nominal PIX frequency, $PIX_n$, then detector 30 outputs a nominal voltage, $V_n$. This voltage is supplied through a buffer amplifier 31 and lowpass filter 32 to a voltage control input of local oscillator 18. The nominal voltage causes the local oscillator to output a frequency which, when mixed with the CATV signal, corresponds to the nominal PIX frequency. However, if the instantaneous PIX frequency drifts above the nominal frequency, detector 30 outputs a lesser voltage which shifts the local oscillator 18 downwardly to counteract the upward frequency drift of the CATV signal and thereby maintain the second intermediate frequency of PIX at the upper limit of the passband. Conversely, if the instantaneous PIX frequency drifts below the nominal frequency, detector 30 outputs a greater voltage to upshift the local oscillator.

The output of filter 24 is also supplied to standard AM demodulator and FM demodulator switch circuit 40 which demodulators detect the video and audio, respectively. The demodulated signal is supplied to baseband video and audio processing circuitry 42 which descrambles the video and audio if they were scrambled, and controls the volume. Then, the processed signal is supplied to RF modulator 44 for transmission to a standard television receiver 46 within a standard television 48 or other video appliance.

Occasionally, as noted above, the CATV signal 14 is interrupted so that only noise is supplied to RF and first IF tuning circuit 16. The noise is mixed with the output of local oscillator 18 and filtered by filter 24. The frequency spectra of the resultant mixed noise signal resembles the shape of frequency response curve 26. Such a frequency spectra is equivalent to a noise carrier located at a center 54 of the passband 29 which carrier is amplitude and phase modulated. Consequently, detector 30 attempts to track the equivalent noise carrier and, because the noise carrier (labeled $N_c$ in FIG. 3) is much below (for example, 3 MHz below) the upper limit 28 of the passband, detector 30 outputs a relatively high voltage, $V_{nc}$, compared to the nominal voltage as illustrated in FIG. 3. It should be noted that changes in the output of detector 30 are slewed by filters and loading internal to detector 30. As a result of the high voltage, the local oscillator 18 is substantially upshifted after a rise time caused by the internal slew of detector 30 and lowpass filter 32.

When the CATV signal 14 returns, the second intermediate frequency of $PIX_n$ is located well above the passband 29 of filter 24 and is therefore severely attenuated. Consequently, detector 30 may not be able to detect and track the $PIX_n$. In such a case, the audio and video reproduction of the selected TV channel remains unacceptable (and may be little more than "snow") until a tune control signal 60 is supplied to a switch 62, and a reference voltage, $V_n$, is thereby supplied to local oscillator 18. The tune control signal is initiated manually by either a change of a channel selector 75 or depression of a push button associated with the same channel. A series resistor 66 within lowpass filter 32 protects the amplifier 30 from the voltage $V_r$, applied to local oscillator 18. In response to the reference voltage, the second intermediate frequency of the selected channel is down-shifted such that $PIX_n$ is located within passband 29, and can be detected by detector 30.

As noted above, the electronics and graphs of FIGS. 1-2 and the aforesaid parts of FIG. 3 represent the prior art, and the problem with the prior art is the requirement for the manually activated tune control signal 60 to track the CATV signal after the period of interruption.

Figure 4:
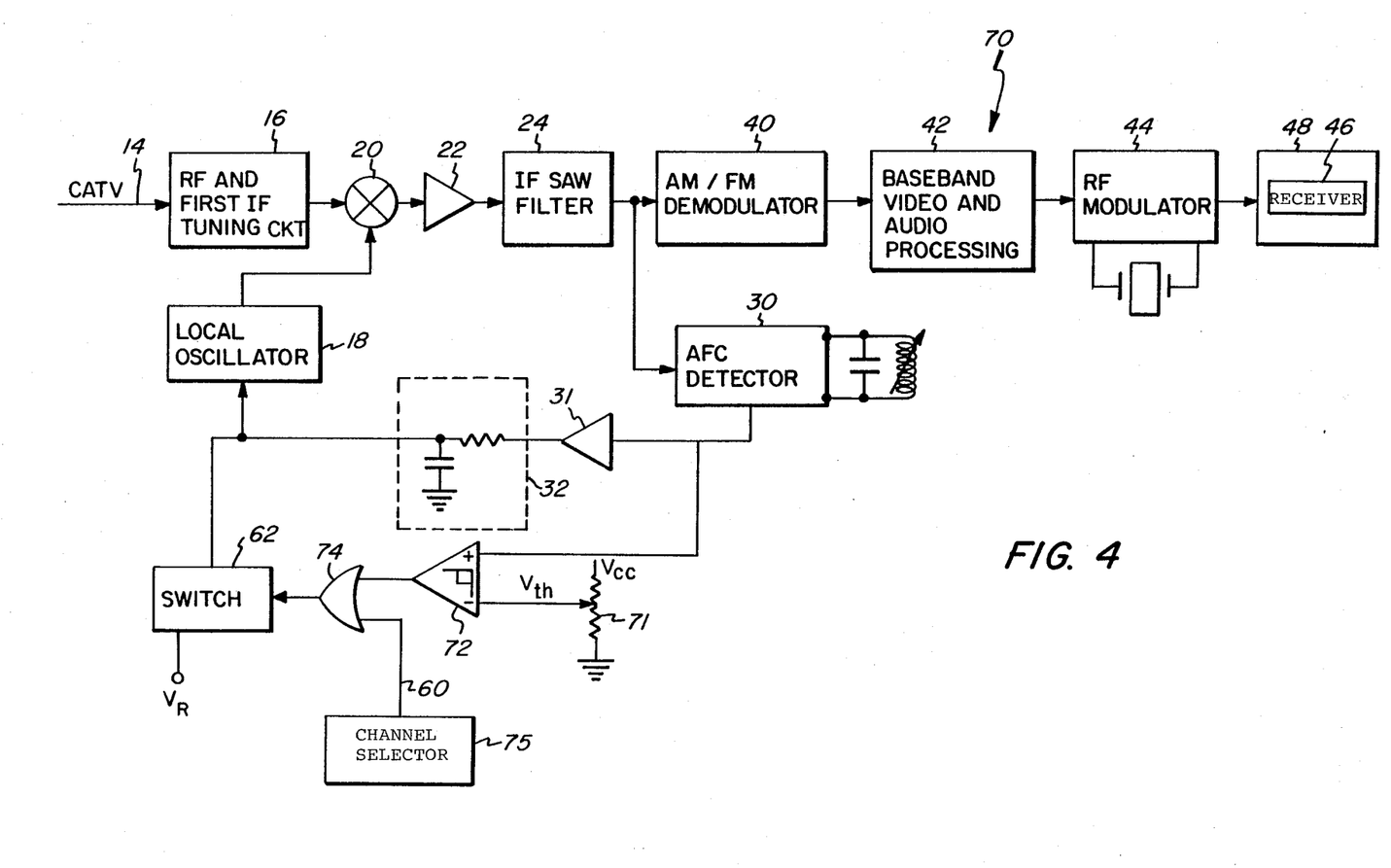
FIG. 4 is a block diagram of electronic components within an automatic frequency control embodying the present invention.

A more fully automatic, frequency control 70 embodying the present invention is illustrated in FIGURE 4. Automatic frequency control 70 is identical to the prior art control 12 except for the addition in control 70 of comparator 72, "OR" gate 74, and potentiometer 71.

Figure 5:
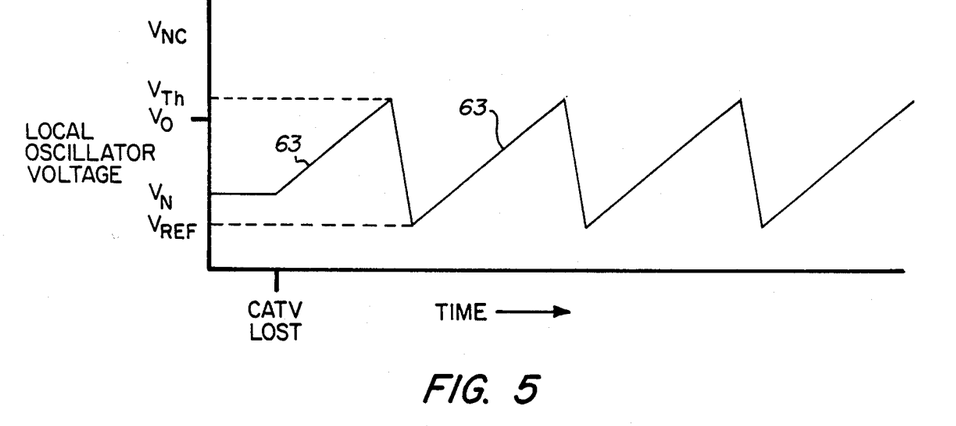
FIG. 5 is a graph illustrating control voltages applied to a voltage control input of a local oscillator of FIG. 4 to track the video carrier before and during a period of absence of the video carrier.

One input of comparator 72 is supplied with the output of detector 30, and the other input is supplied with a threshold voltage, $V_{th}$, via the potentiometer 71. The threshold voltage corresponds to an upper voltage limit of compensated drift. Above this limit, control 70 does not attempt to further compensate for drift because the CATV signal 14 has either been interrupted or otherwise substantially frequency shifted. If the output of detector 30 is greater than the threshold voltage, indicating the need to substantially upshift the second intermediate frequency from the nominal level, comparator 72 outputs a binary 1 level and thereby activates switch 62 via OR gate 74. Consequently, the reference voltage, $V_r$, is supplied to local oscillator 18 as illustrated in FIG. 5. If the CATV signal now returns, the video carrier PIX will be within the passband 29 of filter 24 and readily detected by detector 30. Detector 30 will then output a corresponding voltage to bring local oscillator 18 to its nominal mixing frequency. If, however, the CATV signal 14 has not returned, detector 30 will again attempt to raise the local oscillator frequency to force the equivalent noise carrier frequency to the upper limit 28 of the passband. Because of the lowpass filter 32 and internal slew, the voltage applied to the input of oscillator 18 gradually rises as indicated by the slope of lines 63 in FIG. 5. In the absence of the CATV signal, the voltage output of detector 30 will again rise above $V_{th}$ causing comparator 72 to gain activate switch 62 and thereby supply $V_r$ to the local oscillator. The result is the sawtooth waveform illustrated in FIG. 5 which continues as long as the CATV signal is absent.

Detector 30 can also immediately detect PIX when local oscillator 18 outputs a mixing frequency corresponding to a voltage control input between $V_r$ and $V_o$, a "normal operating range" of detector 30. Thus, if the CATV signal 14 returns when the voltage control input of oscillator 18 is within the normal operating range, detector 30 can immediately detect the video carrier PIX and output a corresponding voltage to shift PIX to the upper limit 28 of passband 29. However, if the CATV signal 14 returns when detector 20 outputs a voltage between $V_o$ and $V_{th}$, detector 30 cannot immediately detect the video carrier PIX. Instead, detector 30 continues to track the equivalent noise carrier and output a voltage rising toward $V_{nc}$ until the voltage input to comparator 72 rises above the threshold voltage. At that time, comparator 72 activates switch 62 to supply $V_r$ to local oscillator 18. Then, the video carrier PIX of the second intermediate frequency will be located within passband 29 of filter 24, and detector 30 can detect the video carrier PIX. Because the threshold voltage is greater than the normal operating range, comparator 72 does not reduce the normal operating range of detector 30.

The tune control signal 60 also activates switch 62 via OR gate 74 whenever a channel selector 75 is manipulated as noted above.

Figure 6:
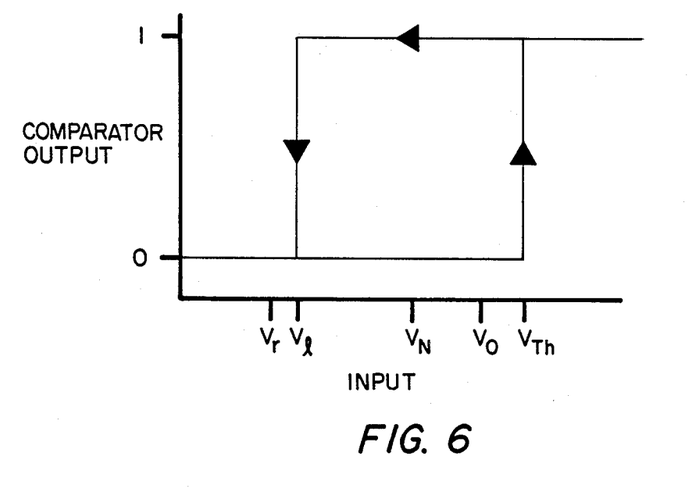
FIG. 6 is a graph illustrating hysteresis response of a comparator within the automatic frequency control of FIG. 4.

In the preferred embodiment of the invention, comparator 72 includes hysteresis control as illustrated in FIG. 6. Under normal conditions in which the CATV signal 14 is present, the video carrier PIX is located within the normal operating range corresponding to a voltage less than $V_{th}$ of detector 30. As long as the voltage output by detector 30 is below $V_{th}$, comparator 72 outputs 0 volts corresponding to a binary 0 so that the reference voltage is not applied to oscillator 18. However, when the voltage output by detector 30 rises above $V_{th}$, comparator 72 outputs a binary 1 voltage to activate switch 62. Then, until the voltage output of detector 30 drops below $V_1$, comparator 72 continues to activate switch 62. This allows times for the voltage of detector 30 to correspond to the reference voltage. When the output of detector 30 falls below $V_1$, comparator 72 outputs binary 0 voltage to deactivate switch 62. Then, until detector 30 again outputs a voltage greater than $V_{th}$, comparator 72 will continue to output the binary 0 voltage. The actual circuitry embodying the comparator with hysteresis control is well known in the art, is adequately defined by FIG. 6, and need not be discussed in detail except to say that it may comprise a Schmitt trigger device. Such a Schmitt trigger device is described in more detail in "Integrated Electronics: Analog and Digital Circuits and Systems" by Millman and Halkias, published by McGraw-Hill Book Company, 1972, pp. 583-585, which pages are hereby incorporated by reference as part of the present disclosure.

Figure 7:
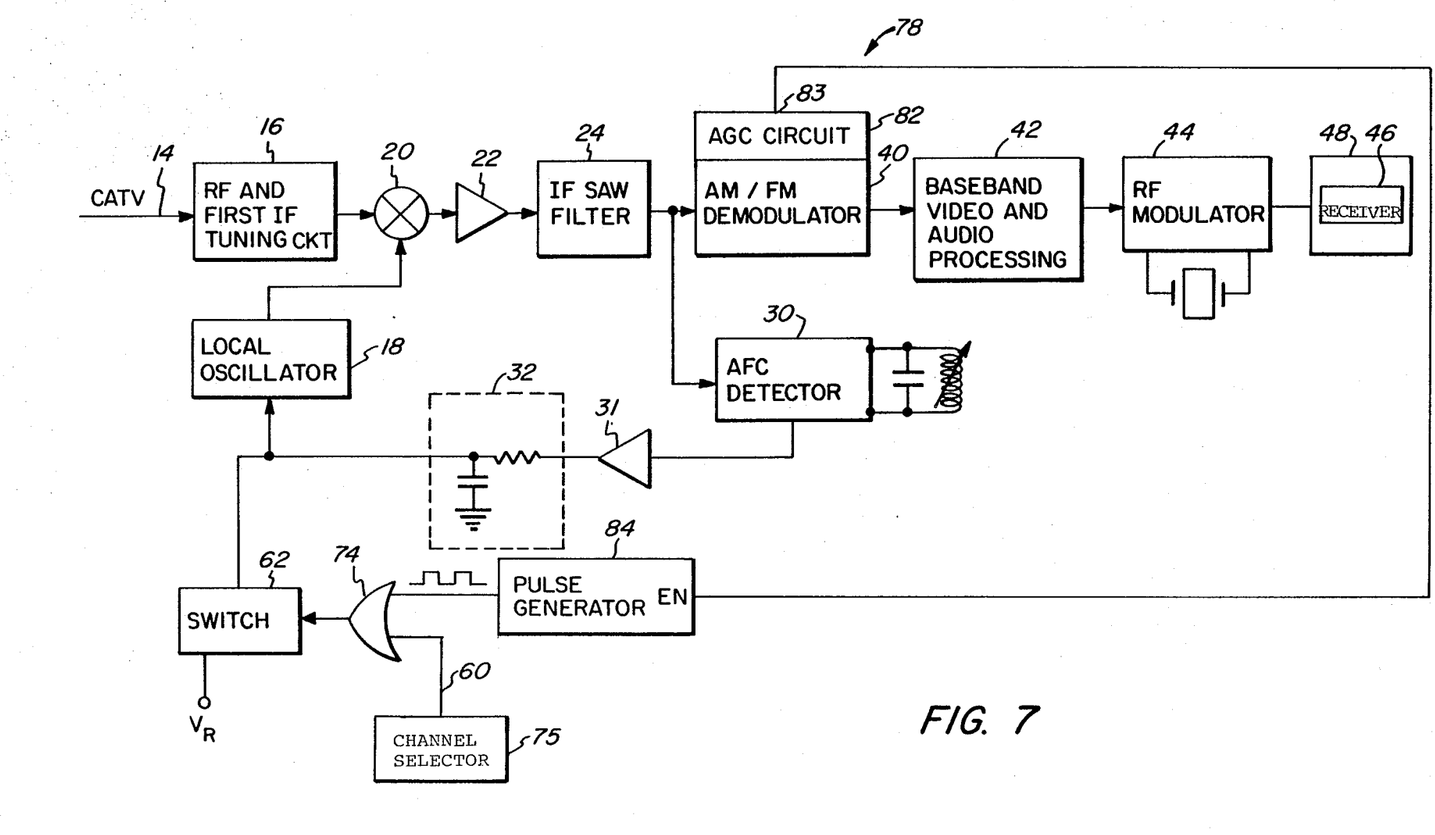
FIG. 7 is a block diagram of electronic components within an automatic frequency control according to another embodiment of the present invention.

FIG. 7 is a block diagram of another automatic frequency control generally designated 78 embodying the present invention. Control 78 is identical to control 12 except that control 78 includes an automatic gain control circuit 82, a pulse generator 84 and OR gate 74. Automatic gain control circuit 82 is a standard type tuned to either the demodulated video or audio. By way of example, AM/FM demodulator 40, detector 30, processing circuit 42 and automatic gain control 82 are provided by a Mitsubishi Model M51365SB integrated circuit. Portions of this integrated circuit may be utilized also in the other controls 12 and 70 described above, and control 90 described below. When a gain indicator output 83 of automatic gain control circuit 82 rises above a binary 1 level indicating the absence of the television signal, pulse generator 84 is enabled and thereby periodically activates switch 62 via OR gate 74 to periodically supply $V_r$ to local oscillator 18. The pulse width is sufficient to allow the voltage output by detector 30 to correspond to $V_r$. Thus, the voltage applied to the control input of oscillator 18 resembles the sawtooth waveform of FIG. 5, and when the CATV signal 14 returns, detector 30 can track the video carrier PIX in the same manner that it tracks the video carrier in control 70. As noted above, the tune control 60 can also activate switch 62.

Figure 8:
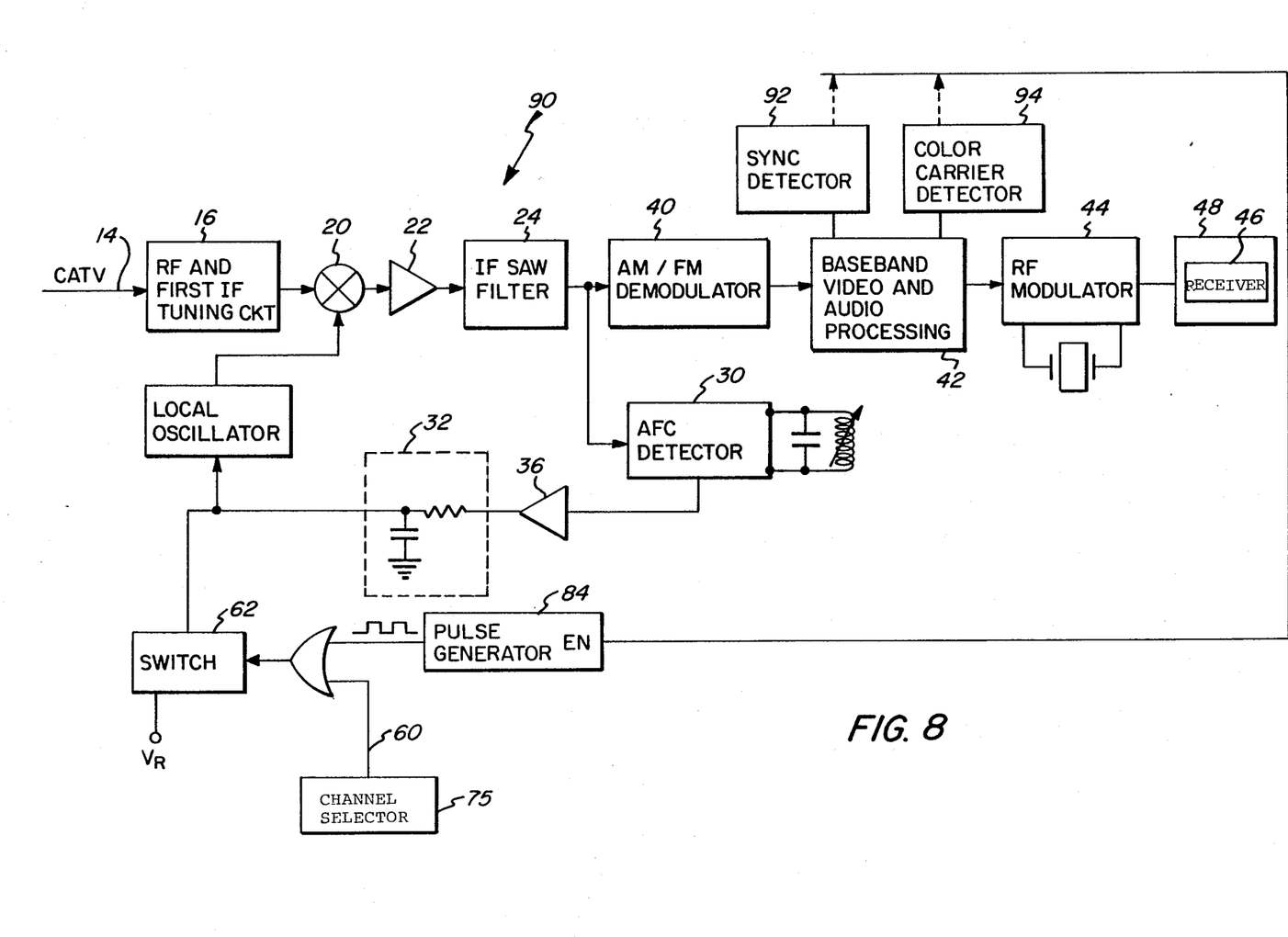
FIG. 8 is a block diagram of electronic components with in automatic frequency controls according to other embodiments of the present invention.

FIG. 8 illustrates two other automatic frequency control circuits generally designated 90 embodying the present invention. Control circuits 90 is identical to control circuit 78 except that control circuit 90 omits automatic gain control circuit 82 and substitutes therefor either horizontal synchronization pulse detector 92 or color carrier detector 94. By way of example, synchronization pulse detection comprises a filter (not shown) which filters out most of the luminance and chrominance signals from the baseband video. Detector 92 also comprises a peak detector (not shown) which detects the horizontal synchronization pulses of the TV signal if present, and a comparator (not shown) which compares the output of the peak detector to a threshold voltage to indicate whether the pulses are present. By way of example also, the color carrier detector 94 comprises an amplifier (not shown) tuned to the color carrier in the baseband signal, a diode (not shown) to detect the output of the amplifier, and a comparator (not shown) to compare the detected output to a threshold voltage corresponding to the presence of the color carrier. In either case, the output of the respective comparator in detector 92 or 94 enables the pulse generator 84 when the horizontal synchronization pulses or color carrier are not present. This will occur when the CATV signal 14 is interrupted. The resultant waveform applied to the control input of oscillator 18 is illustrated in FIG. 5, and detector 30 in control 90 tracks the video carrier PIX after a period of interruption in the same manner as in control circuit 70.

By the foregoing, automatic frequency controls embodying the present invention have been disclosed. However, numerous modifications and substitutions may be made without deviating from the scope of the invention. For example, other types of filters may be substituted for filter 24. Detector 30 can be tuned to detect either the color carrier CIX or sound carrier SIX instead of the luminance carrier PIX. Also, other types of detectors can be utilized to detect the absence of the CATV signal 14. Therefore, the invention has been disclosed by way of illustration and not limitation, and reference should be made to the following claims to determine the scope of the invention.

We claim:

1. An automatic frequency control for a TV signal, said automatic frequency control comprising:
   a voltage controlled local oscillator;
   means for mixing an output of said oscillator with said TV signal;
   detector means, coupled to receive an output of the mixing means, for detecting a component of said TV signal output from the mixing means, and generating a voltage output corresponding to a frequency of said TV signal component, the output of said detector means being coupled to a voltage control input of said oscillator; and
   electronic means for automatically sensing the absence of said TV signal component output from the mixing means, and automatically applying a reference voltage to said voltage control input of said oscillator when said TV signal component is absent from said mixing means; and wherein:
   said detector means is operative to detect said television signal component following the application of said reference voltage to said local oscillator.

2. An automatic frequency control as set forth in claim 1 wherein said detector means generates a voltage corresponding to a TV carrier frequency in the mixed signal.

3. An automatic frequency control as set forth in claim 1 wherein said electronic means determines when the TV signal component is absent based on the output of said detector means.

4. An automatic frequency control as set forth in claim 3 wherein said electronic means comprises:
   a comparator having a first input coupled to the output of said detector means and a second input coupled to a source of threshold voltage; and
   means for applying said reference voltage to said control input of said oscillator when the output of said detector means crosses said threshold voltage.

5. An automatic frequency control as set forth in claim 1 further comprising an intermediate frequency filter connected between the mixing means and a signal input of said detector means, and wherein said frequency of said mixed signal is a carrier frequency of said TV signal and said carrier frequency is located adjacent to or within a passband of said filter when said reference voltage is applied to said voltage control input of said oscillator.

6. An automatic frequency control as set forth in claim 5 further comprising a lowpass filter connected between an output of said detector means and said voltage control input of said oscillator.

7. An automatic frequency control as set forth in claim 4 wherein said comparator includes hysteresis control.

8. An automatic frequency control as set forth in claim 1 wherein said electronic means comprises:
   automatic gain control means tuned to the TV signal component for detecting said absence of said TV signal component; and
   means, coupled to the output of said automatic gain control means, for applying said reference voltage to said voltage control input of said oscillator when said TV signal component is absent.

9. An automatic frequency control as set forth in claim 8 wherein the applying means comprises:
   a periodic pulse generator enabled by said automatic gain control means; and
   means responsive to pulses produced by said pulse generator for applying said reference voltage to said voltage control input of said oscillator.

10. An automatic frequency control as set forth in claim 1 wherein said electronic means comprises:
    carrier detector means for detecting a carrier of said TV signal; and
    means, coupled to an output of said carrier detector means, for applying said reference voltage to said voltage control input of said oscillator when said carrier is absent from said mixing means.

11. An automatic frequency control as set forth in claim 10 wherein said carrier is a color carrier of said TV signal.

12. An automatic frequency control as set forth in claim 10 wherein the application means comprises a periodic pulse generator.

13. An automatic frequency control as set forth in claim 1 wherein said electronic means comprises:
    synchronization detector means for detecting synchronization pulses of said TV signal; and
    means, coupled to an output of said synchronization detector means, for applying said reference voltage to said voltage control input of said oscillator when said synchronization pulses are absent from said mixing means.

14. An automatic frequency control as set forth in claim 13 wherein the application means comprises a periodic pulse generator.

15. An automatic frequency control as set forth in claim 4 wherein said threshold voltage is outside of a normal operating range of said detector means for detecting said TV signal component.

16. An automatic frequency control as set forth in claim 1 wherein after said reference voltage is applied to said oscillator, said detector means outputs a sweeping voltage waveform from approximately said reference voltage toward a voltage associated with the absence of said TV signal component, said detector means detecting said TV signal component during the sweep.

17. An automatic frequency control as set forth in claim 1 wherein said detector is operative to detect said TV signal component when said oscillator outputs a frequency corresponding to said reference voltage.

* * * * *